(12) United States Patent
Cheng et al.

(10) Patent No.: US 10,559,542 B2
(45) Date of Patent: Feb. 11, 2020

(54) CHIP SECURITY FINGERPRINT

(71) Applicant: International Business Machines Corporation, Armonk, NY (US)

(72) Inventors: Kangguo Cheng, Schenectady, NY (US); Shawn P. Fetterolf, Cornwall, VT (US); Chi-Chun Liu, Altamont, NY (US)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 15/920,562

(22) Filed: Mar. 14, 2018

(65) Prior Publication Data

US 2018/0308807 A1    Oct. 25, 2018

Related U.S. Application Data

(62) Division of application No. 15/494,671, filed on Apr. 24, 2017.

(51) Int. Cl.
*H01L 23/00* (2006.01)
*H01L 23/532* (2006.01)
(Continued)

(52) U.S. Cl.
CPC ........ *H01L 23/573* (2013.01); *B81C 1/00031* (2013.01); *H01L 21/7684* (2013.01);
(Continued)

(58) Field of Classification Search
CPC ......... H01L 21/31144; H01L 21/76877; H01L 23/528; H01L 21/02118; H01L 21/0337;
(Continued)

(56) References Cited

U.S. PATENT DOCUMENTS

| 4,510,673 A | 4/1985 | Shils et al. |
| 6,161,213 A | 12/2000 | Lofstrom |

(Continued)

OTHER PUBLICATIONS

Jin, C., et al., "Deconvoluting the Mechanism of Microwave Annealing of Block Copolymer Thin Films", ACS Nano, Mar. 2014, vol. 8, No. 4, pp. 1-13.

(Continued)

*Primary Examiner* — David Chen
(74) *Attorney, Agent, or Firm* — Fleit Intellectual Property Law; Jose Gutman

(57) ABSTRACT

Various methods and structures for fabricating a semiconductor chip structure comprising a chip identification "fingerprint" layer. A semiconductor chip structure includes a substrate and a chip identification layer disposed on the substrate, the chip identification layer comprising random patterns of electrically conductive material in trenches formed in a semiconductor layer. The chip identification layer is sandwiched between two layers of electrodes that have a crossbar structure. A first crossbar in the crossbar structure is located on a first side of the chip identification layer and includes a first set of electrical contacts in a first grid pattern contacting the first side of the chip identification layer. A second crossbar in the crossbar structure is located on a second side of the chip identification layer and includes a second set of electrical contacts in a second grid pattern contacting the second side of the chip identification layer.

20 Claims, 9 Drawing Sheets

(51) Int. Cl.
*H01L 23/528* (2006.01)
*H01L 23/522* (2006.01)
*H01L 21/768* (2006.01)
*B81C 1/00* (2006.01)
*H01L 21/033* (2006.01)
*B82Y 30/00* (2011.01)

(52) U.S. Cl.
CPC .. *H01L 21/76816* (2013.01); *H01L 21/76877* (2013.01); *H01L 23/528* (2013.01); *H01L 23/5226* (2013.01); *H01L 23/5329* (2013.01); *H01L 23/53214* (2013.01); *H01L 23/53228* (2013.01); *H01L 23/53257* (2013.01); *B82Y 30/00* (2013.01); *H01L 21/0337* (2013.01); *H01L 21/76802* (2013.01)

(58) Field of Classification Search
CPC ............. H01L 21/3086; H01L 23/5226; H01L 21/0274; H01L 21/31133; H01L 21/76802; G03F 7/0002; B82Y 30/00; B81C 1/00031; B81C 2201/0149
USPC ......... 257/758, 773, E21.038; 438/128, 618, 438/700
See application file for complete search history.

(56) References Cited

U.S. PATENT DOCUMENTS

| | | | |
|---|---|---|---|
| 7,838,873 B2 | 11/2010 | Clevenger et al. | |
| 8,290,150 B2 | 10/2012 | Erhart et al. | |
| 8,667,430 B1 | 3/2014 | Latypov | |
| 9,012,270 B2 | 4/2015 | Xu et al. | |
| 2013/0233608 A1* | 9/2013 | Feng | H04L 9/3278 174/264 |
| 2014/0042627 A1* | 2/2014 | Edelstein | H04L 9/3278 257/758 |
| 2014/0042628 A1* | 2/2014 | Edelstein | H01L 23/52 257/758 |
| 2014/0335324 A1* | 11/2014 | Kim | B44C 1/227 428/195.1 |
| 2014/0353761 A1 | 12/2014 | Guillom et al. | |

OTHER PUBLICATIONS

Rasappa, S., "Block copolymer self-assembly based device structures", PhD Thesis, University College Cork, 2013, last downloaded from http://hdl.handle.net/10468/1237 on Aug. 15, 2016.

Olynick, D., et al., "Selective Laser Ablation in Resists and Block Copolymers for High Resolution Lithographic Patterning", Journal of Photopolymer Science and Technology, Accepted May 25, 2015, pp. 1-6, vol. 28, No. 5.

Stoykovich, M., et al., "Directed Self-Assembly of Block Copolymers for Nanolithography: Fabrication of Isolated Features and Essential Integrated Circuit Geometries", published on www.acsnano.org on Oct. 6, 2007, pp. 168-175, vol. 1, No. 3.

Han et al., "Effect of Composition of Substrate-Modifying Random Copolymers on the Orientation of Symmetric and Asymmetric Diblock Copolymer Domains", Published Nov. 6, 2008, Macromolecules 2008, 41, 9090-9097.

List of IBM Patents or Patent Applications Treated As Related.

* cited by examiner

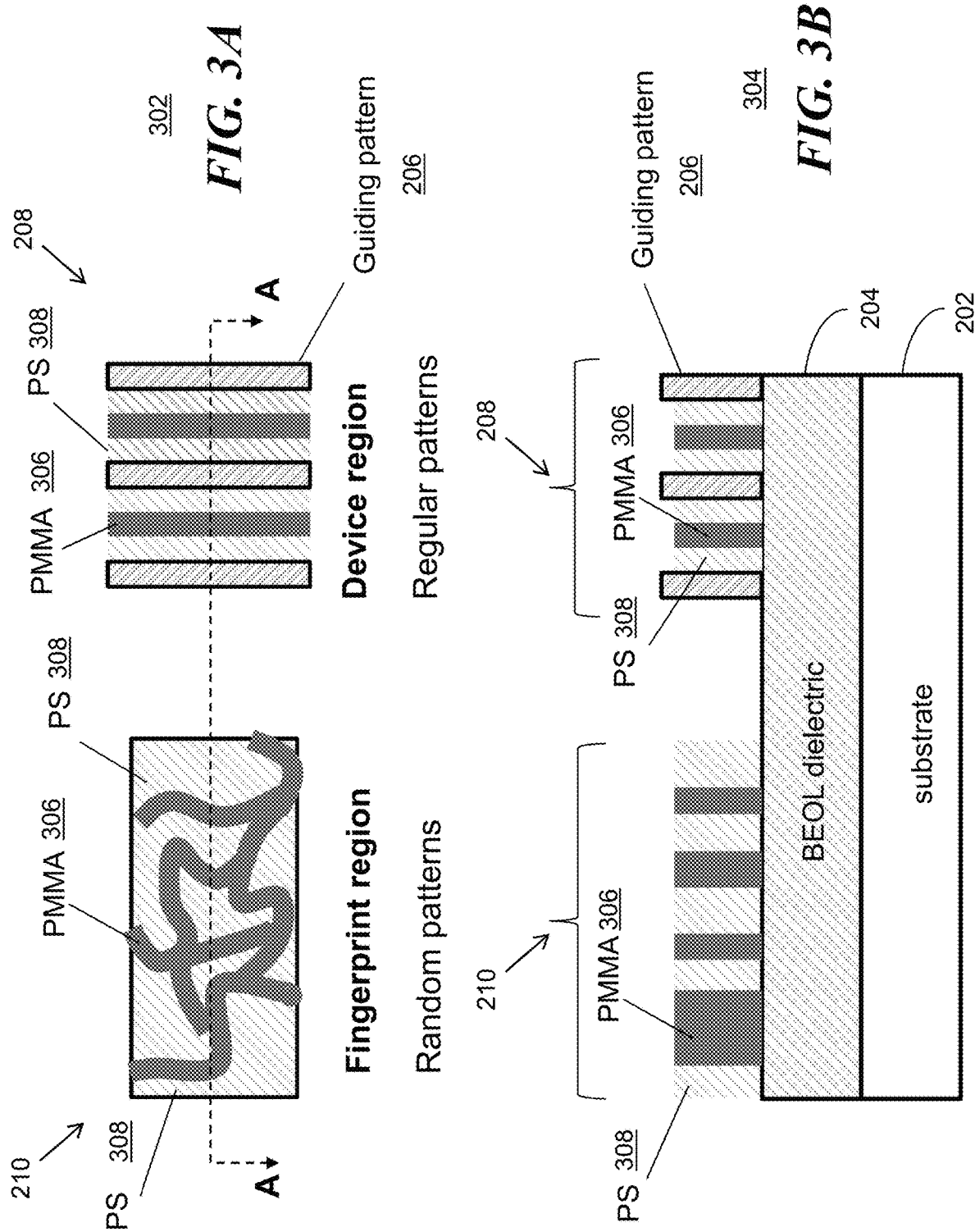

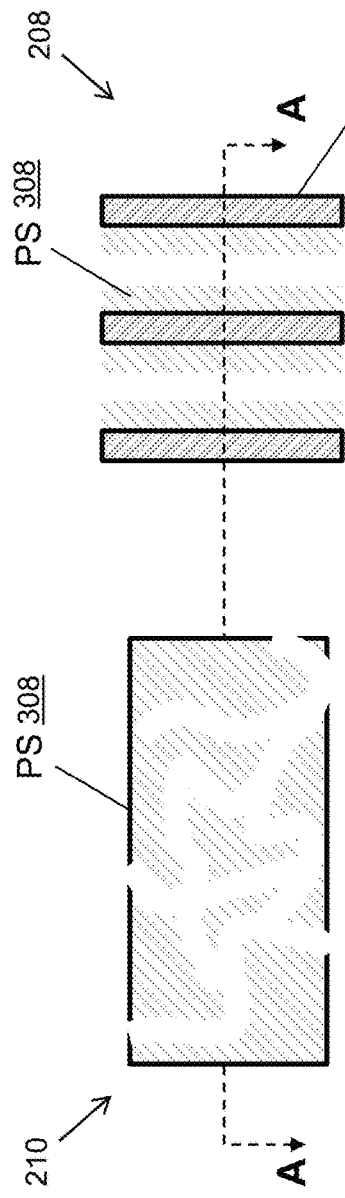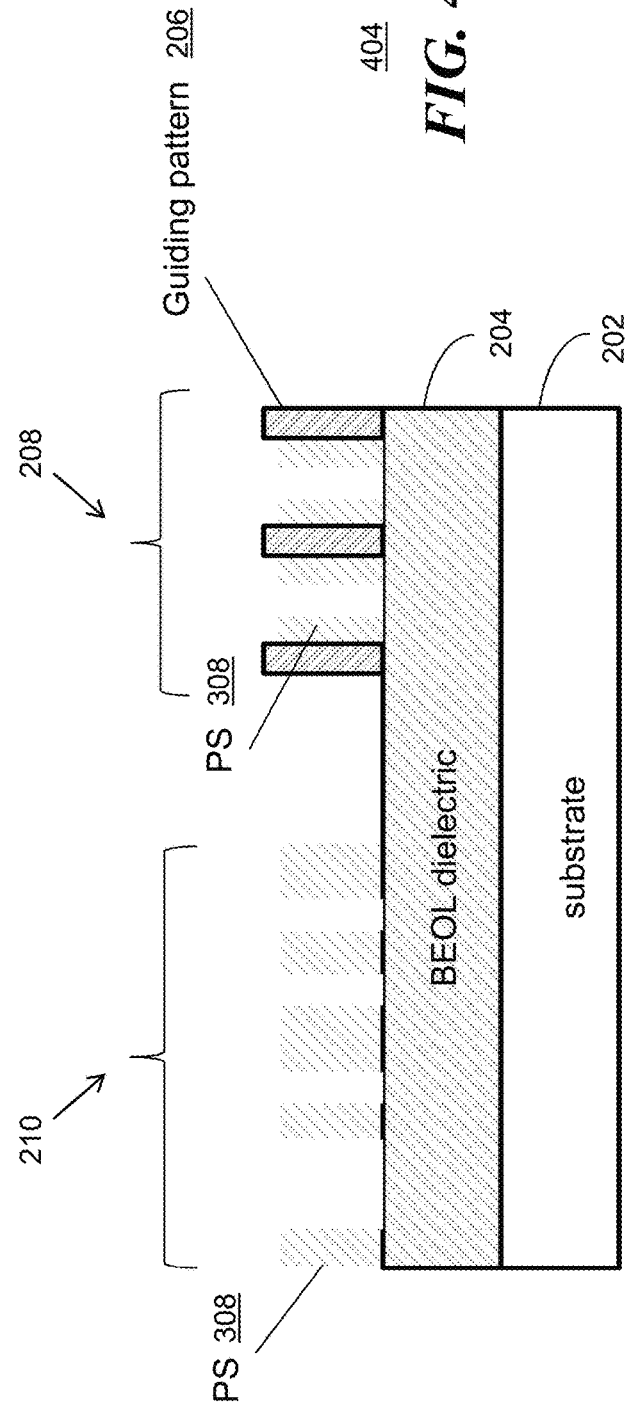

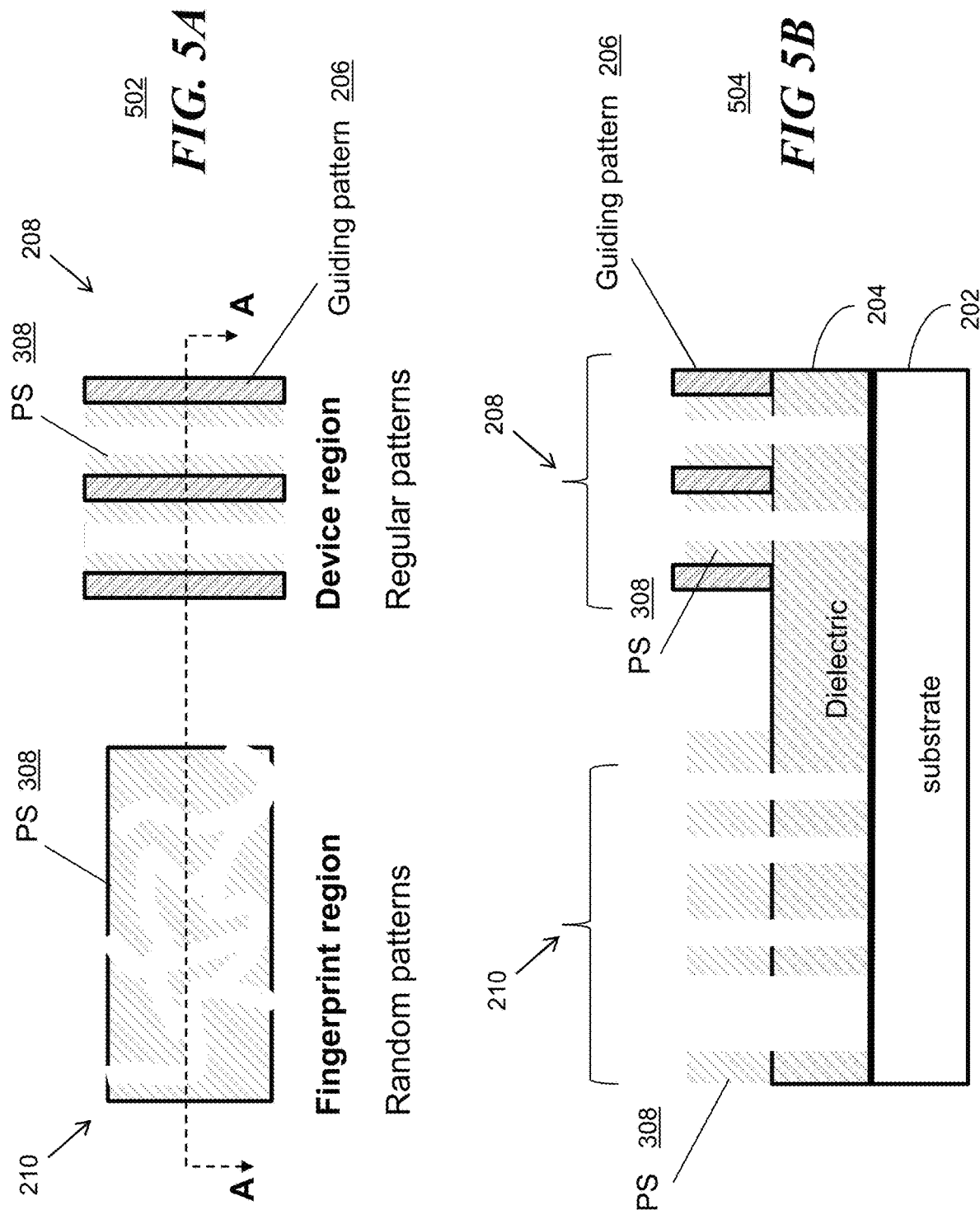

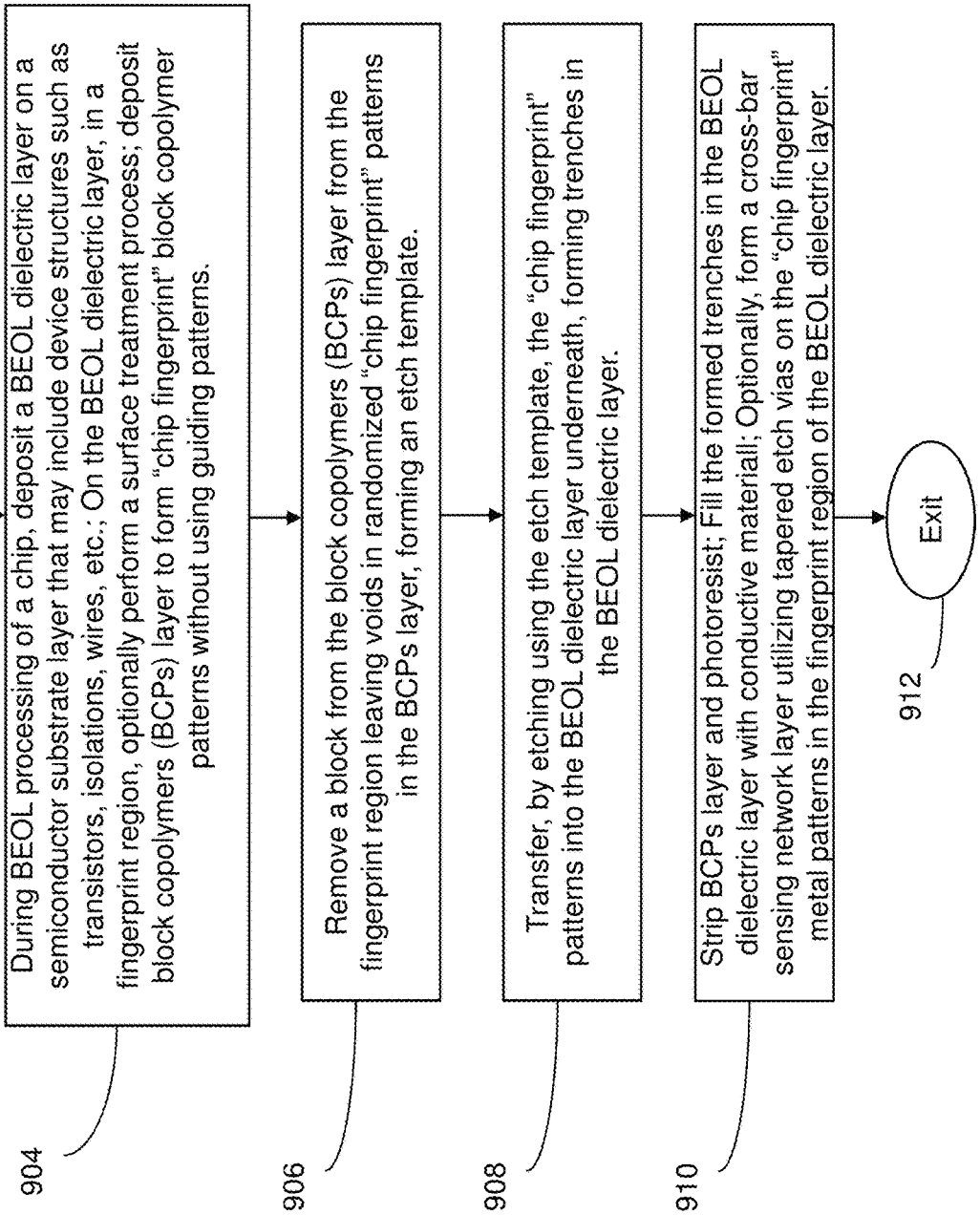

CHIP SECURITY FINGERPRINT

BACKGROUND OF THE INVENTION

The present disclosure generally relates to the field of semiconductors, and more particularly relates to a method of fabricating semiconductor chips, in which the method uses directed self-assembly (DSA) of block copolymers (BCPs) for patterning in fabricating the semiconductor chips.

Semiconductor chip security has become increasingly important. A unique numerical number, e.g., a serial number, assigned to each chip has been the conventional approach to identify authentic chips fabricated by an authorized manufacturer. However, an unauthorized manufacturer can forge a numerical number to produce a counterfeit chip. The proliferation of counterfeit chips in modern semiconductor manufacturing has been an increasing problem without a viable solution.

Therefore, there is a need to fabricate semiconductor chips that can be uniquely identified as authentic chips fabricated by an authorized manufacturer.

SUMMARY OF THE INVENTION

Various embodiments of the present invention consist of fabrication of a unique on-chip fingerprint by taking advantage of random pattern formation of unguided, self-assembled BCPs, as will be discussed below. The random pattern formed by unguided BCPs is analogical to a fingerprint of a human being that can be used as a unique identification of each semiconductor chip.

The chip fingerprint can be formed during chip fabrication in which DSA of BCPs is used for patterning. If DSA is already being used for patterning a BEOL layer, fingerprints can be generated at a pre-defined location without additional processing steps. A fabrication method and related semiconductor chip structure, for example, produce semiconductor chips that can be uniquely identified as authentic chips fabricated by an authorized manufacturer.

According to various embodiments, a method for fabricating a semiconductor chip structure comprises: forming at least one back-end-of-line layer (BEOL) dielectric layer on a substrate, the substrate including semiconductor devices; depositing layer of BCPs on the BEOL dielectric layer, annealing the BCPs and forming a self-assembled random pattern; selectively removing one of the blocks in the BCPs and forming an etch template with the remaining materials of the layer of BCPs, the etch template having an etching pattern based on the removed one of the BCPs; etching, with the etch template, the etching pattern into the BEOL dielectric layer, the etching forming trenches in a random pattern in the BEOL dielectric layer; and depositing conductive material in the trenches in the BEOL dielectric layer forming a random pattern of conductive material in the BEOL dielectric layer.

According to another embodiment, the BEOL dielectric layer includes the random pattern of conductive material comprising a chip identification layer, the method further comprises forming a crossbar sensing network comprising at least two layers of electrodes that have a crossbar structure, in which: a first crossbar, formed on a first side of the chip identification layer, includes a first layer of electrodes and a first set of electrical contacts in a first grid pattern contacting the first layer of electrodes and the first side of the chip identification layer; and a second crossbar, formed on a second side of the chip identification layer, includes a second layer of electrodes and a second set of electrical contacts in a second grid pattern contacting the second layer of electrodes and the second side of the chip identification layer.

In another embodiment, a semiconductor chip structure comprises a substrate; a chip identification layer disposed on the substrate, the chip identification layer comprising random patterns of electrically conductive material in trenches formed in a back-end-of-line (BEOL) dielectric layer; and the chip identification layer being sandwiched between at least two layers of electrodes that have a crossbar structure in which: a first crossbar, on a first side of the chip identification layer, includes a first layer of electrodes and a first set of electrical contacts in a first grid pattern contacting the first layer of electrodes and the first side of the chip identification layer; and a second crossbar, on a second side of the chip identification layer, includes a second layer of electrodes and a second set of electrical contacts in a second grid pattern contacting the second side of the chip identification layer.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which:

FIGS. 3A and 3B are respective top view and cross-sectional side view of the example partial semiconductor chip structure of FIG. 2, in a second step of the example fabrication process;

FIGS. 4A and 4B are respective top view and cross-sectional side view of the example partial semiconductor chip structure of FIG. 2, in a third step of the example fabrication process;

FIGS. 5A and 5B are respective top view and cross-sectional side view of the example partial semiconductor chip structure of FIG. 2, in a fourth step of the example fabrication process;

FIG. 9 is an operational flow diagram illustrating an example process for fabricating a semiconductor chip structure, according to an embodiment of the present invention.

DETAILED DESCRIPTION

Figure 1:
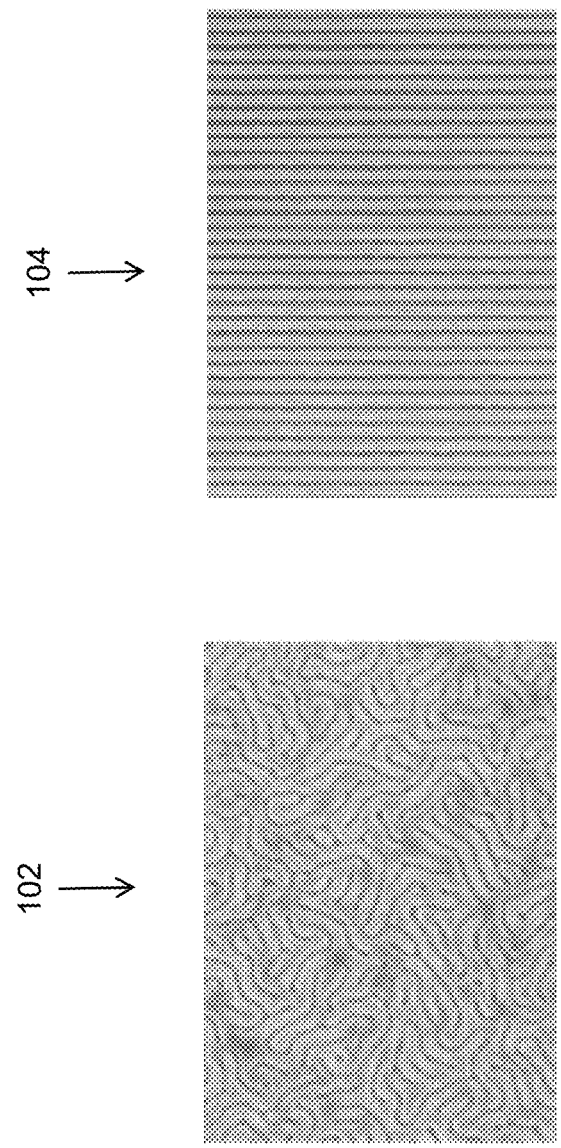
FIG. 1 is a top view of an example of unguided BCPs patterns and an example of guided BCPs patterns.

It is to be understood that the present disclosure will be described in terms of given illustrative example processes for fabricating semiconductor chips. However, other semiconductor architectures, structures, substrate materials, and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present discussed embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used as part of a process in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Various embodiments of the present invention consist of semiconductor chips all on the same wafer. This semiconductor chip structure and fabrication process, for example, can be used to create an integrated circuit chip.

Various embodiments of the present invention provide a method and structure to produce a unique on-chip fingerprint by taking advantage of random pattern formation of unguided, self-assembled block copolymers (BCPs). The random pattern formed by BCPs is analogical to the fingerprint of a human being, providing a unique identification ("fingerprint") of each chip.

The chip fingerprint can be formed during chip fabrication in which directed self-assembly (DSA) of BCPs is used for patterning.

Referring now to the drawings in which like numerals represent the same or similar elements, FIG. 1 shows an example of unguided self-assembled BCPs patterns 102 and an example of DSA of BCPs patterns 104, and their use in a semiconductor chip fabrication process will be discussed below.

Figure 2:
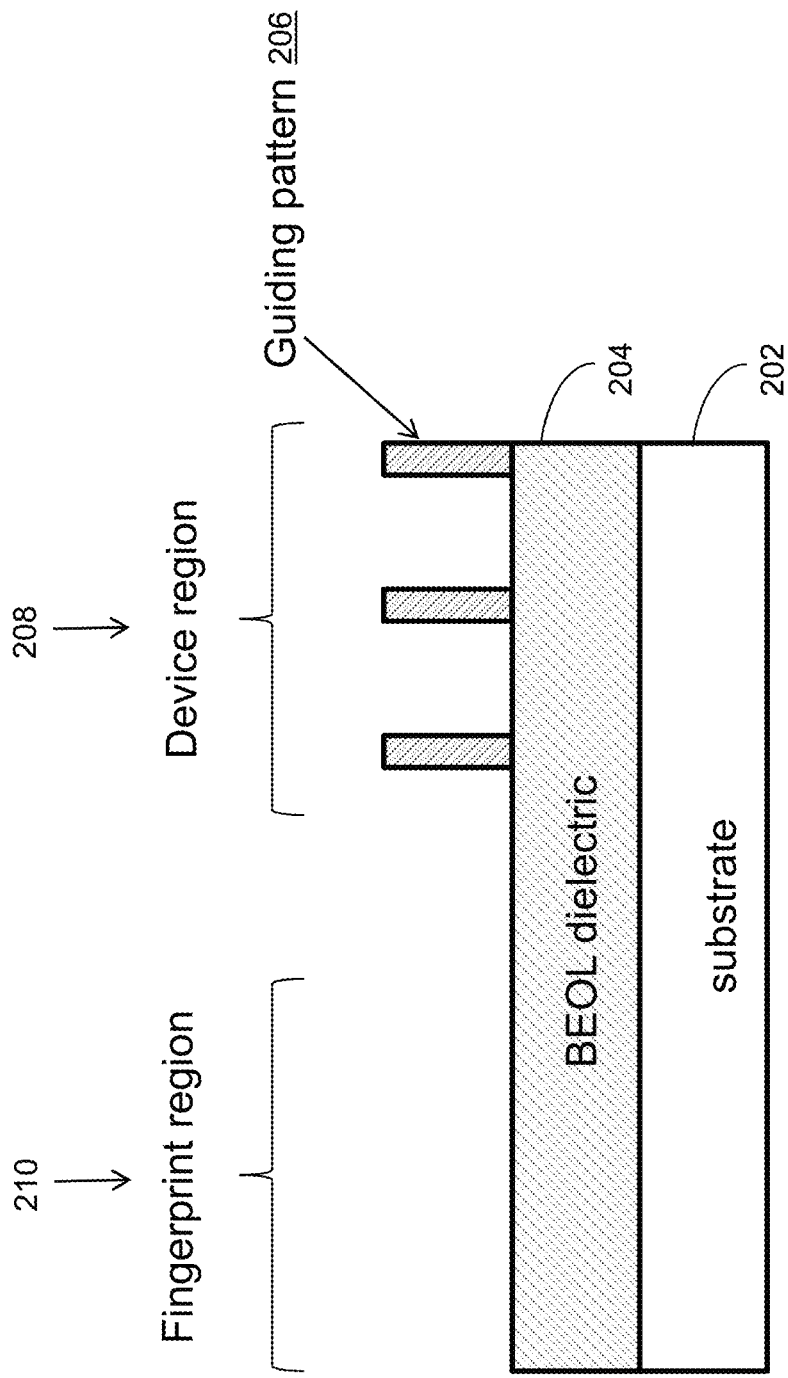
FIG. 2 is a cross-sectional side view of an example partial semiconductor chip structure in a first step of an example fabrication process, according to an embodiment of the present invention.

The example process begins, referring to FIG. 2, with a silicon circuit supporting substrate 202. The substrate 202 can be any suitable substrate, including but not limited to silicon (Si), SiGe germanium, silicon-on-insulator (SOI), semiconductor-on-insulator (SeOI), or the like. The substrate 202 can include devices such as transistors, capacitors, etc. However, typically those devices in the substrate 202 have not been fully interconnected to form a complete circuit. A back-end-of-line (BEOL) dielectric layer 204 is disposed on the underlying substrate 202. According to one example embodiment, the BEOL dielectric layer 204 is directly disposed on the substrate 202. The BEOL dielectric layer 204 can have added conductive material comprising such as Cu, W, TiN, Al, a metal, and the like, forming conductive wiring that interconnects the devices in the underlying substrate layer 202. There can be more than one BEOL dielectric layer 204 disposed on the underlying substrate 202. Multiple BEOL dielectric layers can be disposed on top of one another on the underlying substrate 202. Each BEOL dielectric layer, in this case, is referred to as a separate level of BEOL dielectric layer.

A fabrication process using conventional photolithography and photoresist to create conductive wires in the BEOL dielectric layer 204 may not have the capability to space the wires sufficiently close to each other to be able to interconnect the devices in the underlying substrate layer 202. That is, miniaturization and close spacing of devices and structures in the underlying substrate layer 202 can be beyond the capability of conventional photolithography resolution to create the interconnecting wires at the required spacing.

Figure 6A:
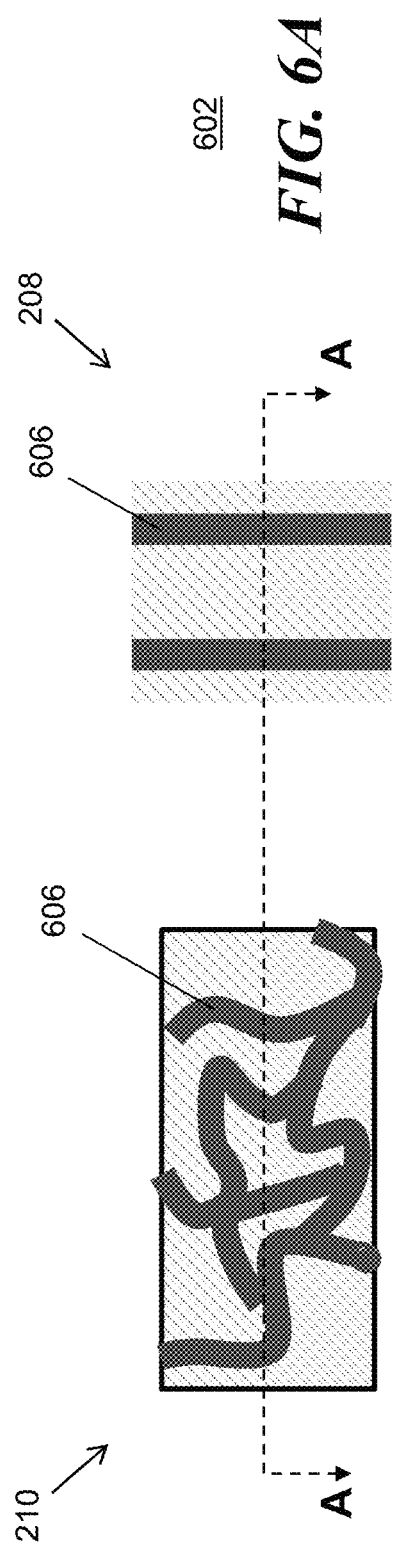
FIGS. 6A and 6B are respective top view and cross-sectional side view of the example partial semiconductor chip structure of FIG. 2, in a fifth step of the example fabrication process.
Figure 6B:
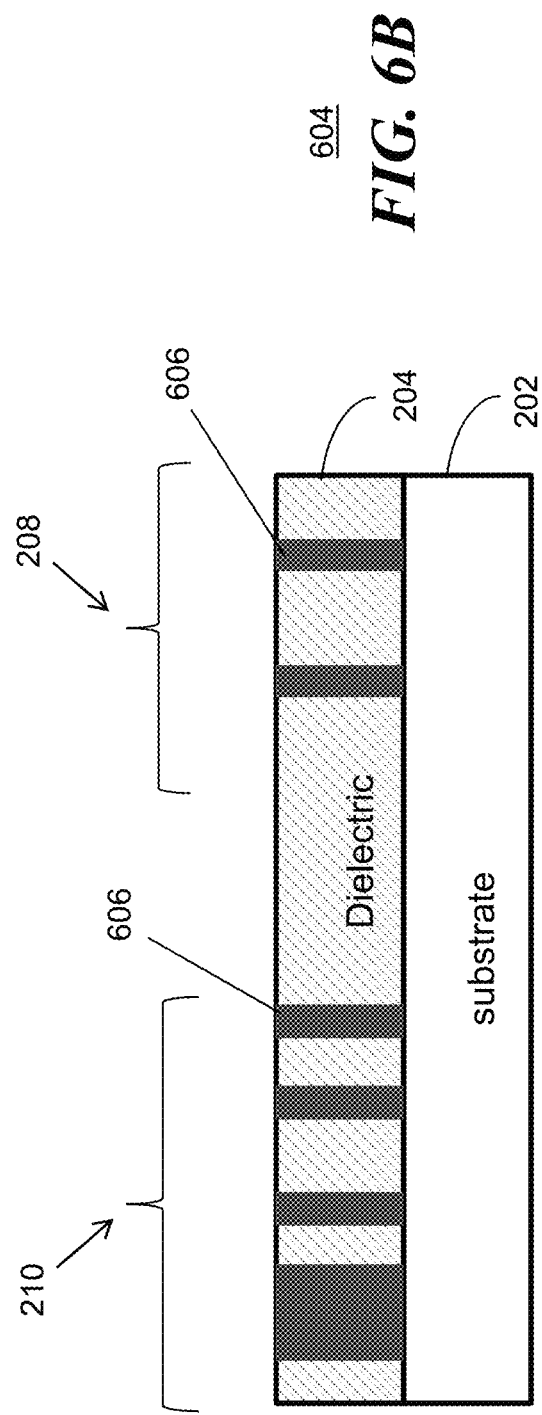

Directed self-assembly (DSA) patterning enables formation of the conductive wires at close spacing beyond the limits of resolution of conventional photolithography. For example, as shown in FIG. 2, the device region 208 includes guiding patterns (GPs) 206 that may be formed at spacing within the capability of conventional photolithography. For example, the guiding patterns 206 can use photoresist or spin-on carbon. Due to the surface affinity of the BEOL dielectric layer may not be proper to induce the desired self-assembled structures, a surface treatment process may be used to control the sidewall and bottom surface affinity for later DSA patterning. This surface treatment of substrate surface(s) is typically done by depositing and anchoring a thin layer of polymers (e.g., depositing a layer of surface modification materials) to the GPs, to a surface of the BEOL dielectric layer, and to other substrate surfaces, where the composition of the polymers (surface modification materials) can be tuned to meet the surface affinity requirement for later DSA patterning. Some examples can be found in Macromolecules, 2008, 41 (23), pp 9090-9097 by Han et al. Then, as shown in FIG. 3A, a layer of BCPs, which is a linear polymer composed of two chemically distinct blocks, e.g. polystyrene (PS) and poly(methyl methacrylate) (PMMA) is deposited on the treated surface(s) of the substrate covering both region 210 and 208. After an annealing process, BCPs self-assemble into microdomains of PS and PMMA with dimension and pitch determined by molecular weight of the BCP. In the device region 208, the guiding patterns 206 direct the BCPs to align with the GPs. The microdomains 306, 308, together with the guiding patterns 206 could form patterns with density higher than that of the photolithography guiding lines 206. In this way, DSA patterning can be used to form metal wires 606 in the device region 208 (see FIGS. 6A and 6B). According to certain embodiments, the spacing between metal wires formed in the device region 208 could be much denser than the limits of resolution of conventional lithography.

It should be noted that the constituents of BCPs can include a variety of polymer choices, such as polystyrene-block-poly(methyl methacrylate) (PS-b-PMMA), polystyrene-block-polydimethylsiloxane (PS-b-PDMS), poly(styrene-b-vinylpyridine) (PS-b-PVP), poly(styrene-block-poly (lactic acid) (PS-b-PLA), polystyrene-b-polyisoprene (PS-b-PI), and the like.

With reference back to FIG. 2, we will discuss a new and novel process that takes advantage of the DSA of BCPs for device region 208 and form a fingerprint pattern in the fingerprint region 210 in the BEOL dielectric layer 204. In the fingerprint region 210 there are no guiding patterns 206 such as used in the device region 208.

As shown in FIG. 3, in the device region 208 the guiding patterns 206 will guide the formation and alignment of the BCPs. That is, the microdomains 306 and 308 line up with the guiding lines 206. However, the fingerprint region 210 has no guiding patterns. Therefore, a random self-assembled structure such as 102 shown in FIG. 1 or such as another example shown in FIG. 8A will form. Such a fingerprint structure has uniform dimension and pitch but with no specific orientation.

As shown in FIG. 4, one block of the BCPs is selectively removed by a dry or wet etch process, forming an etch template in both the device region 208 and the fingerprint region 210. Through further pattern transfer processes, such as Reactive Ion Etching (RIE), trenches are formed in the BEOL dielectric layer 204, as shown in FIG. 5.

Referring to FIG. 6, the BCP etch template and the guiding patterns have been removed by ashing or similar processes. Conductive material 606 comprising one or more of Cu, W, TiN, Al, a metal, and the like, has filled into the trenches in the BEOL dielectric layer by plating, using physical vapor deposition (PVD) or chemical vapor deposition (CVD), or a combination of both methods, and followed by a planarization process, such as a chemical and/or mechanical polishing (CMP) process, to remove the overburden of conductive material deposited on top of the BEOL dielectric layer. The conductive material in the trenches forms a random pattern of conductive material in the BEOL dielectric layer.

Figure 7:
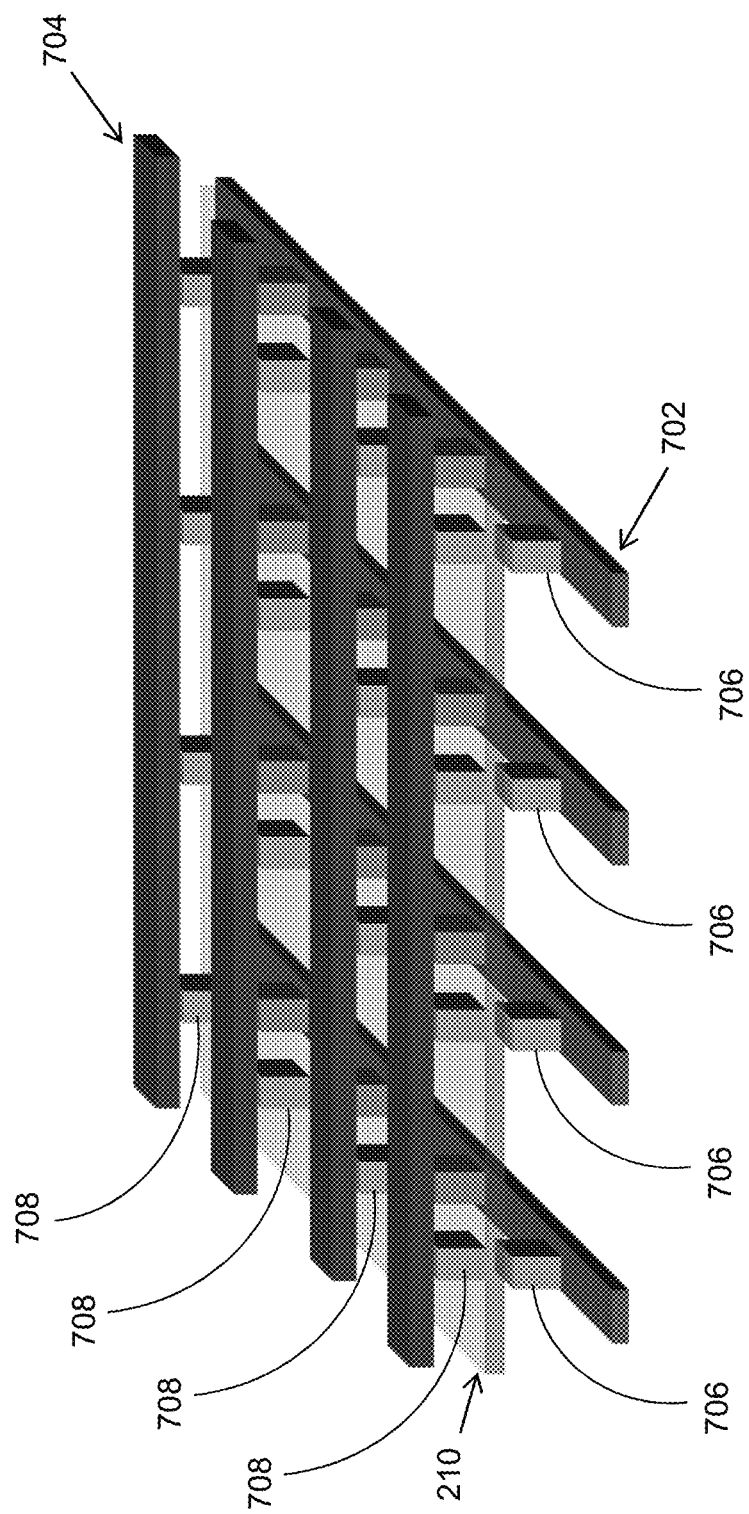
FIG. 7 is a perspective view of an example of a chip identification layer being sandwiched between two layers of electrodes that have a crossbar structure, according to an embodiment of the present invention.

In a semiconductor chip fabrication process, as shown in FIG. 7, the fingerprint region 210, including the conductive material 606 in a random pattern, can be sandwiched between two sets of conductors 702, 704 in a crossbar pattern. The first set of conductors 702 is disposed under the first side (e.g., the bottom side) of the fingerprint region 210. The second set of conductors 704 is disposed on the second side (e.g., the top side) of the fingerprint region 210. According to an example implementation, the first side is directly opposite the second side.

A first set of electrical contacts 706 are formed in a first grid pattern and electrically connect the first set of conductors 702 to the first side (e.g., the bottom side) of the fingerprint region 210 of the BEOL dielectric layer 204. According to various embodiments, the first set of conductors 702 and the first grid pattern of electrical contacts 706 can be fabricated in the underlying substrate layer 202.

Electrical contacts 708 are formed in a second grid pattern and electrically connect the second set of conductors 704 to the second side (e.g., the top side) of the fingerprint region 210. According to one example arrangement, the first grid pattern matches the second grid pattern. According to various embodiments, the second set of conductors 704 and the second grid pattern of electrical contacts 708 can be fabricated in a second BEOL dielectric layer (not shown) disposed on the BEOL dielectric layer 204. Fabrication of two sets of conductors in a crossbar pattern can be similar to fabricating a conventional dual damascene structure or a crossbar sensing network used in a crossbar memory.

For example, the first set of conductors 702 can be the columns of a sensor network. The second set of conductors 704 can be the rows of the sensor network. At each intersection region 802, 804 (see FIG. 8A) between the crossbar columns 702 and rows 704, the column conductors 702 and the row conductors 704 can be scanned and sensed to determine whether there is an open circuit or a short circuit between the respective column 702 and row 704 that are connected to the particular intersection region 802, 804, by a via 806, 808, 810, 812.

If there is a short circuit electrically connecting the column 702 and row 704, it means that there is conductive material at the particular intersection region 802, 804, in the fingerprint region 210 in the BEOL dielectric layer 204. This conductive material is part of the random pattern of conductive material (e.g., metal) that filled the trenches in the BEOL dielectric layer 204. See FIG. 6 and the discussion above regarding FIG. 6.

If there is an open circuit between the column 702 and row 704, it means that there is no conductive material at the particular intersection region 802, 804, in the BEOL dielectric layer 204. This lack of conductive material at the intersection region 802, 804, according to this example, implies that the intersection region 802, 804, was mainly made of polystyrene at the random fingerprint stage; and therefore did not create a trench in the BEOL dielectric layer 204.

In this way, for example, by scanning and sensing all of the individual columns 702 and rows 704 at the particular intersection regions 802, 804, a "fingerprint pattern" of ones and zeros is electrically read (e.g., collected) from the fingerprint array in the fingerprint region 210. See FIG. 6A. The electrically read "fingerprint pattern" of ones and zeros corresponds to a set of pixels in a grid over an image of the random pattern of conductive material 606. By embedding inside a semiconductor chip a random pattern of conductive material 606 sandwiched between a crossbar sensor network 702, 704, provides a secure image of "pixels" in the fingerprint region 210 that can be electrically read from an external or built-in reading device (or sensor circuit) to determine the unique identity ("fingerprint") of the semiconductor chip. This "fingerprint pattern" feature securely embedded inside of a semiconductor chip, and which is reliably readable external to the chip, provides improved chip security and deters proliferation of counterfeit chips.

Figure 8B:
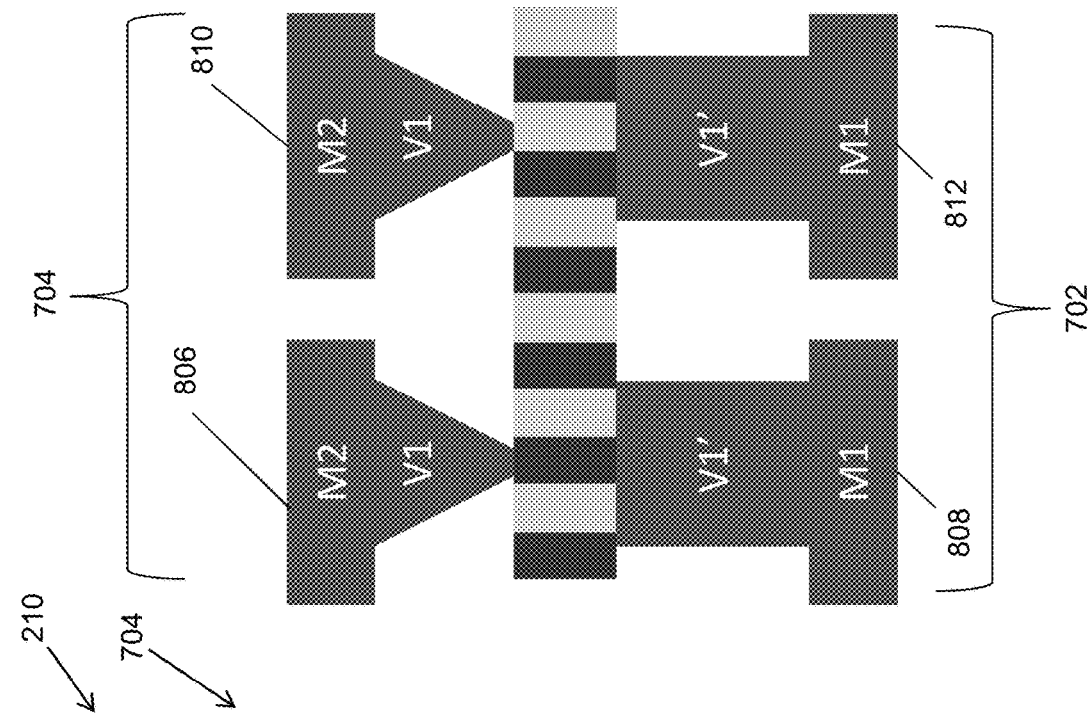
FIGS. 8A and 8B are respective top view and cross-sectional side view of example electrical contacts formed between the chip identification layer and the two layers of electrodes having a crossbar structure sandwiching the chip identification layer therebetween as illustrated in FIG. 7, according to an embodiment of the present invention.
Figure 8A:
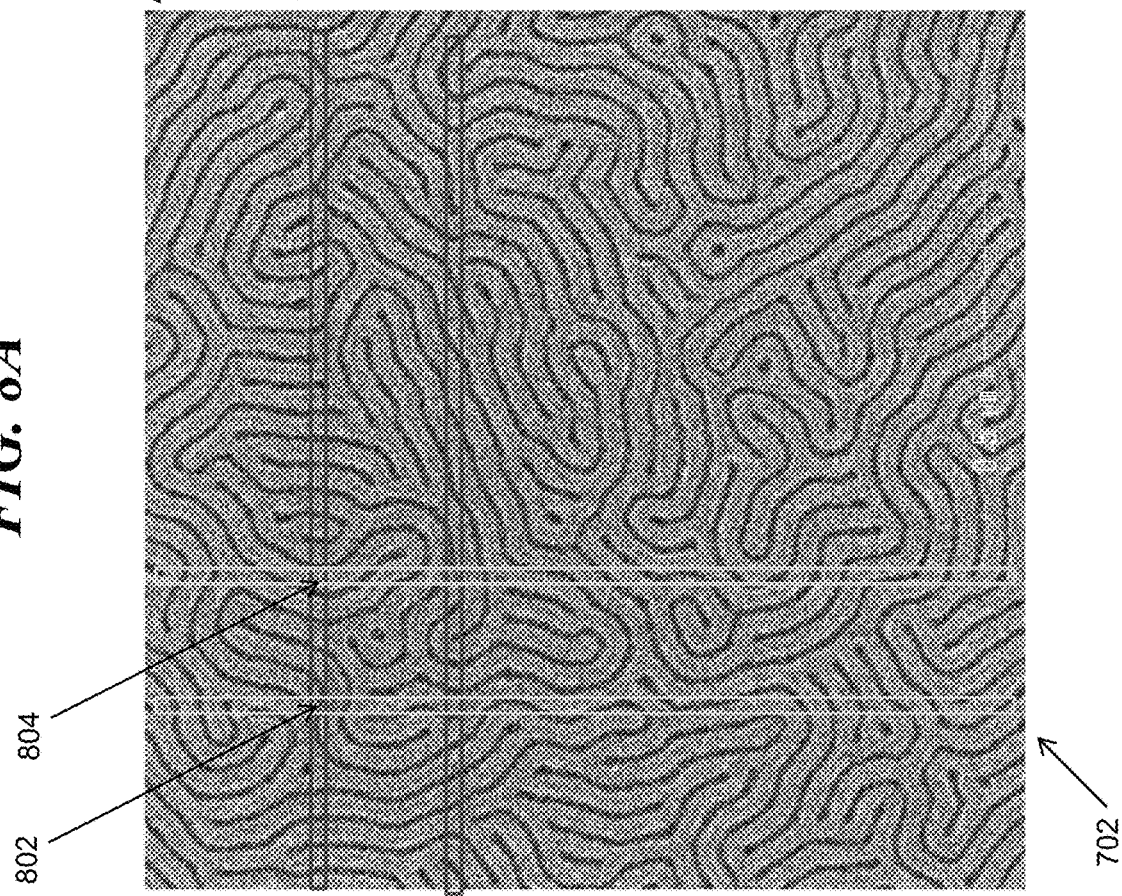

Referring to FIG. 8B, according to one example, two crossbar interconnect regions 802, 804 are shown. Electrical contacts 806, 810 are part of the electrical contacts 708 (See FIG. 7) in the second grid pattern. The electrical contacts 806, 810 can utilize tapered etch to form sharp upper via as shown in FIG. 8B or tapered etch together with an intermediate hard mask layer to create a vertical but small CD via at similar size as the tip of the upper via in FIG. 8B, so that the fingerprint array (i.e., the second set of electrical contacts 708 in the second grid pattern) can be electrically connected and probed at relaxed pitch and high resolution, as shown. The electrical contacts 808, 812 are part of the electrical contacts 706 in the first grid pattern. The electrical contacts 808, 812 can also be connected at a relaxed pitch, as shown. In this case, V1' is patterned by lithography and a single damascene process, e.g. a dielectric layer is deposited on M1 layer, lithographically defined and etched where V1' becomes a void in the dielectric at this stage. A conductive material such as Cu is then filled into the void and overfilled on the top surface of the BEOL dielectric layer. Finally, a CMP process is used to remove the overburden Cu and leave only the Cu in the void. M2/V1 structure is created in a similar way but with a typical dual damascene process.

Referring to FIG. 9, an operational flow diagram illustrates an example process for fabricating a semiconductor chip structure, according to an embodiment of the present disclosure. The process is entered, at step 902, and then proceeds to step 904, in which a BEOL dielectric layer on a semiconductor substrate layer is processed to add conductive material wiring and other structures to a semiconductor chip. A chip fingerprint derived from a self-assembled block copolymers (BCPs) random pattern is formed, as shown in FIG. 3 and discussed above.

The process continues, at step 906, by selectively removing one of the blocks in the BCPs from the fingerprint region 210, leaving voids where the material was removed and forming an etch template. Then, at step 908, the chip fingerprint pattern is transferred (e.g., by using the etch template to etch) into the BEOL dielectric layer underneath the voids, thereby forming trenches in the BEOL dielectric layer.

At step 910, the BCPs, and any photoresist remaining, are removed and the trenches are filled with conductive material comprising such as Cu, W, TiN, Al, a metal, and the like. This forms a random pattern of conductive material in the BEOL dielectric layer 204.

Optionally, a crossbar sensing network is formed sandwiching, on either side, the fingerprint region 210 of the BEOL dielectric layer 204, as discussed above and shown in FIGS. 7, 8A, and 8B. Tapered etching is utilized to form sharp upper via 806, 808, that allows probing the fingerprint array in the fingerprint region 210 at relaxed pitch and high resolution, as has been discussed with reference to FIG. 8B. After the crossbar pattern conductors and electrical contacts have been formed, the example process is exited, at step 912.

Although specific embodiments of the disclosure have been disclosed, those having ordinary skill in the art will understand that changes can be made to the specific embodiments without departing from the scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure might be used in one embodiment thereof without use of other features of the present disclosure. As such, the foregoing description should be considered as merely illustrative of the principles, teachings, examples, and exemplary embodiments of the present disclosure, and not a limitation thereof.

In addition, these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A method for fabricating a semiconductor chip structure, the method comprising:
   forming at least one back-end-of-line layer (BEOL) dielectric layer on a substrate, the substrate including semiconductor devices;
   depositing a layer of block copolymers (BCPs) on the BEOL dielectric layer, annealing the BCPs to self-assemble into microdomains of individual BCPs with dimension and pitch based on molecular weight of the individual BCPs, and forming a self-assembled random pattern of BCPs with uniform dimension and pitch but with no specific orientation;
   selectively removing one block from the layer of BCPs leaving voids in the remaining layer of BCPs and forming an etch template;
   etching, using the etch template, the BEOL dielectric layer, the etching forming trenches in a random fingerprint pattern in a fingerprint region in the BEOL dielectric layer, the trenches in the random fingerprint pattern in the fingerprint region extending from a top surface of the BEOL dielectric layer to a bottom surface of the BEOL dielectric layer;
   depositing conductive material in the trenches in the BEOL dielectric layer followed by a planarization process to remove overburden of conductive material deposited on the top surface of the BEOL dielectric layer, forming a random fingerprint pattern of conductive material in the fingerprint region in the BEOL dielectric layer, the conductive material in the random fingerprint pattern extending from the top surface of the BEOL dielectric layer to the bottom surface of the BEOL dielectric layer;
   sandwiching the conductive material in the random fingerprint pattern in the fingerprint region between first and second sets of conductors in a crossbar pattern, the first set of conductors being electrically connected to a first set of electrical contacts in a first grid pattern disposed under, and contacting the bottom surface of, the BEOL dielectric layer, and the second set of conductors being electrically connected to a second set of electrical contacts in a second grid pattern disposed on, and contacting, the top surface of the BEOL dielectric layer, and wherein at an intersection of one of the first set of electrical contacts contacting the bottom surface and one of the second set of electrical contacts contacting the top surface, a presence of conductive material of the random fingerprint pattern in the BEOL dielectric layer indicating a first fingerprint pattern and a lack of conductive material indicating a second fingerprint pattern, different from the first fingerprint pattern.

2. The method of claim 1, wherein the conductive material deposited in the trenches comprises metal.

3. The method of claim 1, further comprising, after the etching of the BEOL dielectric layer, removing the etch template from the BEOL dielectric layer.

4. The method of claim 1, further comprising after the etching of the BEOL dielectric layer, removing the etch template and photoresist from the BEOL dielectric layer.

5. The method of claim 1, wherein the BEOL dielectric layer including the random fingerprint pattern of conductive material comprising a chip identification layer, the method further comprising forming a crossbar sensing network comprising at least two layers of electrodes that have a crossbar structure, in which
   a first crossbar, formed on a first side of the chip identification layer, includes the first set of conductors and the first set of electrical contacts in the first grid pattern contacting the first side of the chip identification layer; and
   a second crossbar, formed on a second side of the chip identification layer, includes the second set of conductors and the second set of electrical contacts in the second grid pattern contacting the second side of the chip identification layer.

6. The method of claim 5, wherein the first grid pattern matches the second grid pattern.

7. The method of claim 5, wherein the first set of conductors and the first set of electrical contacts are fabricated in the substrate.

8. The method of claim 5, wherein the second set of conductors and the second set of electrical contacts are fabricated in a second BEOL dielectric layer.

9. The method of claim 5, wherein the first side is directly opposite the second side, and wherein the first set of electrical contacts in the first grid pattern contacting the first side matches the second set of electrical contacts in the second grid pattern contacting the second side.

10. The method of claim 5, wherein the chip identification layer is directly disposed on the substrate.

11. The method of claim 10, wherein the first set of conductors and the first set of electrical contacts are fabricated in the substrate.

12. The method of claim 10, wherein the second set of conductors and the second set of electrical contacts are fabricated in a second BEOL dielectric layer.

13. The method of claim 1, wherein the depositing a layer of BCPs on the BEOL dielectric layer comprises:
   depositing a layer of surface modification materials, in a surface treatment process, on a surface of the BEOL dielectric layer to control surface affinity for later Directed Self-Assembly (DSA) patterning, followed by depositing the layer of BCPs on the surface of the BEOL dielectric layer treated with the surface treatment process.

14. A method for fabricating a semiconductor chip structure, the method comprising:
   forming at least one back-end-of-line layer (BEOL) dielectric layer on a substrate, the substrate including semiconductor devices;
   depositing a layer of block copolymers (BCPs) on the BEOL dielectric layer, annealing the BCPs to self-assemble into microdomains of individual BCPs with dimension and pitch based on molecular weight of the individual BCPs, and forming a self-assembled random pattern of BCPs with uniform dimension and pitch but with no specific orientation;
   selectively removing one block from the layer of BCPs leaving voids in the remaining layer of BCPs and forming an etch template;
   etching, using the etch template, the BEOL dielectric layer, the etching forming trenches in a random fingerprint pattern in a fingerprint region in the BEOL dielectric layer, the trenches in the random fingerprint pattern extending in the fingerprint region from a top surface of the BEOL dielectric layer to a bottom surface of the BEOL dielectric layer;
   depositing conductive material in the trenches in the BEOL dielectric layer followed by a planarization process to remove overburden of conductive material deposited on the top surface of the BEOL dielectric layer, forming a random fingerprint pattern of conductive material in the fingerprint region in the BEOL dielectric layer, the conductive material in the random fingerprint pattern extending from the top surface of the BEOL dielectric layer to the bottom surface of the BEOL dielectric layer; and
   wherein the BEOL dielectric layer including the random fingerprint pattern of conductive material in the fingerprint region comprising a chip identification layer, the method further comprising forming a crossbar sensing network comprising at least two layers of electrodes that have a crossbar structure, in which
      a first crossbar, formed on a first side of the chip identification layer, includes a first set of conductors and a first set of electrical contacts in a first grid pattern contacting the first set of conductors and the first side of the chip identification layer; and
      a second crossbar, formed on a second side of the chip identification layer, includes a second set of conductors and a second set of electrical contacts in a second grid pattern contacting the second set of conductors and the second side of the chip identification layer, and wherein at an intersection of one of the first set of electrical contacts contacting the first side and one of the second set of electrical contacts contacting the second side, a presence of conductive material of the random fingerprint pattern in the BEOL dielectric layer indicating a first fingerprint pattern and a lack of conductive material indicating a second fingerprint pattern, different from the first fingerprint pattern; and
   wherein the depositing a layer of BCPs on the BEOL dielectric layer comprises:
      depositing a layer of surface modification materials, in a surface treatment process, on a surface of the BEOL dielectric layer to control surface affinity for later Directed Self-Assembly (DSA) patterning, followed by depositing the layer of BCPs on the surface of the BEOL dielectric layer treated with the surface treatment process.

15. The method of claim 14, wherein the first grid pattern matches the second grid pattern.

16. The method of claim 14, wherein the first set of conductors and the first grid pattern of electrical contacts are fabricated in the substrate.

17. The method of claim 14, wherein the second set of conductors and the second grid pattern of electrical contacts are fabricated in a second BEOL dielectric layer.

18. The method of claim 14, wherein the first side is directly opposite the second side, and wherein the first set of electrical contacts in the first grid pattern contacting the first side matches the second set of electrical contacts in the second grid pattern contacting the second side.

19. The method of claim 14, wherein the chip identification layer is directly disposed on the substrate.

20. The method of claim 19, wherein the first set of conductors and the first set of electrical contacts are fabricated in the substrate.

* * * * *